(12) United States Patent
Senoo

(10) Patent No.: US 9,214,241 B2
(45) Date of Patent: Dec. 15, 2015

(54) SEMICONDUCTOR MEMORY DEVICE AND ERASING METHOD

(71) Applicant: Winbond Electronics Corp., Taichung (TW)

(72) Inventor: Makoto Senoo, Tokyo (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/272,512

(22) Filed: May 8, 2014

(65) Prior Publication Data

US 2015/0092491 A1 Apr. 2, 2015

(30) Foreign Application Priority Data

Oct. 1, 2013 (JP) .................................. 2013-206243

(51) Int. Cl.
G11C 16/04 (2006.01)
G11C 16/14 (2006.01)
G11C 16/16 (2006.01)

(52) U.S. Cl.
CPC ................ *G11C 16/14* (2013.01); *G11C 16/16* (2013.01)

(58) Field of Classification Search
CPC .......................... G11C 16/0483; H01L 27/115
USPC ............... 365/185.11, 185.17, 185.29
See application file for complete search history.

(56) References Cited

U.S. PATENT DOCUMENTS

| 8,369,158 B2 | 2/2013 | Goda et al. |
| 8,482,988 B2 | 7/2013 | Berco |
| 2008/0151646 A1 | 6/2008 | Doyle et al. |
| 2008/0181020 A1 | 7/2008 | Yu et al. |
| 2010/0238730 A1 | 9/2010 | Dutta et al. |
| 2012/0120740 A1 | 5/2012 | Shim et al. |
| 2013/0314995 A1* | 11/2013 | Dutta et al. ............... 365/185.17 |
| 2013/0329496 A1 | 12/2013 | Lee et al. |

FOREIGN PATENT DOCUMENTS

| JP | 2009-163782 | 7/2009 |
| JP | 2011-187152 | 9/2011 |
| JP | 2011192349 | 9/2011 |
| KR | 20130035553 | 4/2013 |

OTHER PUBLICATIONS

"Office Action of Korea Counterpart Application" with English translation, issued on Jul. 21, 2015, p. 1-p. 7, in which the listed reference was cited.

* cited by examiner

*Primary Examiner* — Huan Hoang
(74) *Attorney, Agent, or Firm* — Jianq Chyun IP Office

(57) ABSTRACT

A reliable semiconductor memory device and an erasing method for erasing data in a reliable manner are provided. The erasing method is applied to erase a semiconductor memory device having a memory array, and the memory array has an NAND string. A predetermined voltage is applied to a gate of a select transistor of the NAND string, and the predetermined voltage is applied to a word line of a memory cell of the NAND string. An erasing voltage is applied to a substrate region at a first timing, and the substrate region has the NAND string. The gate of the select transistor is floated at a second timing. Here, there is a fixed time interval between the first timing and the second timing, and the second timing is later than the first timing.

8 Claims, 7 Drawing Sheets

SEMICONDUCTOR MEMORY DEVICE AND ERASING METHOD

CROSS-REFERENCE TO RELATED APPLICATION

This application claims the priority benefit of Japan application serial no. 2013-206243, filed on Oct. 1, 2013. The entirety of the above-mentioned patent application is hereby incorporated by reference herein and made a part of this specification.

BACKGROUND

1. Field of the Invention

The invention relates to a semiconductor memory device having an NAND flash memory. More particularly, the invention relates to an erasing method.

2. Description of Related Art

It is well known that an NAND flash memory includes a memory array having an NAND string, and the NAND string has a plurality of memory cells serially connected together. In the memory cells, binary data or multi-bit data may be programmed or erased. Along with device sophistication, the distance between the memory cells and the bit line select transistor or the source line select transistor of the NAND string is reduced, and capacitance coupling between devices or between a device and a substrate is increased, which may render unexpected operational results. For instance, Patent Literature 1 discloses the following: during a data writing operation, a channel voltage of the NAND string is boosted due to coupling effects; in order to prevent the boosted channel voltage of the NAND string from being transmitted to the bit line select transistor, dummy memory cells are placed between the bit line select transistor and the memory cells, and thereby the dummy memory cells may interrupt the connection between the bit line select transistor and the memory cells during the data writing operation.

RELATED ART

Patent Literature

[Patent Literature 1] Japan Patent Publication No. 2011-192349

SUMMARY OF THE INVENTION

FIG. 1 is a diagram illustrating circuitry of an exemplary NAND string, and the NAND string has dummy memory cells. As shown in FIG. 1, in one block, (n+1) NAND strings NU are arranged in a column direction, and plural memory cells are serially connected by the (n+1) NAND strings NU. Each NAND string NU includes serially connected memory cells $MC_i$ (i=0, 1, ..., and 63), a pair of dummy memory cells DMC connected to two ends of the memory cells, a bit line select transistor TD connected to a drain of one of the dummy memory cells DMC, and a source line select transistor TS connected to a source of the other dummy memory cell DMC. The drain of the bit line select transistor TD is connected to a corresponding bit line GBL, and the source of the source line select transistor TS is connected to the common source line SL. The NAND strings NU constituting the block are formed in the p well.

The control gates of the memory cells $MC_i$ are connected to word lines $WL_i$, the control gates of the dummy memory cells DMC are connected to dummy word lines DWL, and the gates of the select transistors TD and TS are connected to select gate lines SGD and SGS alongside the word lines $WL_i$. The dummy memory cells DMC and the memory cells MC are constituted in the same way, and bias voltages are applied to the dummy memory cells DMC and the memory cells MC. However, the dummy memory cells DMC are ruled out from the programming object of data.

Table 1 exemplarily shows the bias voltage applied to the flash memory during various operations. During the data reading operation, a certain positive voltage is applied to the bit line, a certain voltage (e.g., 0V) is applied to the select word line, a read pass voltage (e.g., 4.5V) is applied to a non-select word line, a positive voltage (e.g., 4.5V) is applied to the select gate lines SGD and SGS, the bit line select transistor TD and the source line select transistor TS are turned on, and a voltage at 0V is applied to the common source line. A voltage, for example, equivalent to the read pass voltage is applied to the dummy word lines DWL. During the data programming (writing) operation, a high programming voltage $V_{prog}$ (e.g., 15V to 20V) is applied to the select word line, a middle voltage (e.g., 10V) is applied to the non-select word line, the bit line select transistor TD is turned on, the source line select transistor TS is turned off, and a voltage corresponding to "0" or "1" data is supplied to the bit line GBL. A voltage exemplarily equivalent to the middle voltage is applied to the dummy word lines DWL. During the erasing operation, a voltage at 0V is applied to the select word line in the block, a high voltage (e.g., 18V) is applied to the p well, and the select gate lines SGD and SGS are floated. A voltage at 0V applied to the select word line is also applied to the dummy word lines DWL. Here, the electrons of the floating gates are drawn to the substrate, and data are erased in unit of blocks.

TABLE 1

|  | Erasing | Writing | Reading |
|---|---|---|---|
| select word line | 0 | 15~20 V | 0 |
| non-select word line | F | 10 V | 4.5 |
| SGD | F | Vcc | 4.5 |
| SGS | F | 0 | 4.5 |
| SL | F | Vcc | 0 |
| p well | 18 | 0 | 0 |

FIG. 2 is a flow chart illustrating an erasing operation on an existing flash memory according to prior art. A voltage at 0V is applied to the dummy word lines DWL and the word lines WL0 to WL63 in the selected block (in step S100), and the bit line select transistor TD and the source line select transistor TS are floating (in step S110). An erasing voltage is applied to the p well in the substrate (in step S120), and an erasing operation is performed after waiting for a fixed time interval passing (in step S130). The erasing voltage is applied between the p well and the control gates of the memory cells $MC_i$ and the dummy memory cells DMC, electrons in the floating gate are drawn into the p well by means of an F-N tunnel, and the threshold value of the memory cells $MC_i$ and the threshold value of the dummy memory cells DMC are biased to be negative.

FIG. 3 is a schematic diagram illustrating variations in voltages of the p well, the select transistor TD/TS, the memory cells MC, and the dummy memory cells DMC during the erasing operation. Here, $V_{PW}$ represents the voltage of the p well, and $V_{TD}$ and $V_{TS}$ respectively represent the gate voltages of the bit line select transistor TD and the source line select transistor TS. At the timing t0, a voltage at 0V is applied to the dummy word lines DWL and the word lines WL, and the bit line select transistor TD and the source line select transistor TS are floating. At the timing t1, the erasing voltage is applied to the p well. For instance, an erasing pulse whose voltage increases in a stepwise manner is applied to the p well. In response to the erasing pulse, the voltage $V_{PW}$ of the p well starts to be boosted. At the same time, the gate voltages $V_{TD}$ and $V_{TS}$ of the select transistors TD and TS capacitance coupled to the p well are boosted, as shown by the dotted lines in FIG. 3. At the timing t2, the voltage $V_{PW}$ of the p well is boosted to about 18V; during the period from the timing t2 to the timing t3, the fixed time interval required for performing the erasing operation is determined to have passed (in step S130 shown in FIG. 2), and the electrons are drawn from the floating gate to the p well.

During the period of performing the erasing operation from the timing t2 to the timing t3, the gate voltages $V_{TD}$ and $V_{TS}$ of the select transistors TD and TS are set so that the voltage difference between $V_{TD}$ or $V_{TS}$ and p well level could to be lower than a fixed electrical potential according to a coupling ratio of the select transistors TD and TS and the p well. That is, as shown in FIG. 3, if the potential difference $V_a$ between the voltage $V_{PW}$ of the p well and the gate voltages $V_{TD}$ or $V_{TS}$ of the select transistors TD or TS ($V_a = V_{PW} - V_{TD}$ or $V_a = V_{PW} - V_{TS}$) is not set to be lower than a fixed value, the select transistors TD and TS are likely to be broken down due to time dependent dielectric breakdown (TDDB). TDDB means that a transistor is broken down if a voltage is applied to the transistor for a long time, even though no high voltage is applied to the gate of the transistor. Hence, given that $V_a < V_{PW}$–TDDB is satisfied, the coupling ratio between the p well and the select transistors TD and TS is set. For instance, the gate voltages $V_{TD}$ and $V_{TS}$ of the select transistors TD and TS are boosted to about 17V, and the equation $V_a = 18V - 17V = 1V$ is set.

However, if the gate voltages $V_{TD}$ and $V_{TS}$ of the select transistors TD and TS are raised, the dummy memory cells DMC adjacent to the select transistors TD and TS may be affected by the high gate voltages $V_{TD}$ and $V_{TS}$ of the select transistors TD and TS. If the distance between the dummy memory cells DMC and the select transistors TD and TS is reduced due to device sophistication, the threshold value of the dummy memory cells cannot be sufficiently biased to be negative during the erasing operation because the capacitance coupling between the dummy memory cells DMC and the select transistors TD and TS causes the voltages of the dummy memory cells DMC to be boosted. The threshold value of the dummy memory cells DMC is ideally the same as the threshold value of the memory cells MC; if the threshold value of the dummy memory cells DMC is not stabilized, the issue of uneven distribution of the threshold value of the memory cells MC becomes worse, or the data reading operation or the data programming operation becomes unstable.

In embodiments of the invention, a reliable data erasing method and a reliable semiconductor memory device are provided.

According to an embodiment of the invention, in the erasing method of the semiconductor memory device, a predetermined voltage is applied to a gate of a select transistor of an NAND string, and the predetermined voltage is applied to a word line of a memory cell of the NAND string. An erasing voltage is applied to a substrate region having the NAND string at a first timing. The gate of the select transistor is floated at a second timing; here, a fixed time interval is between the first timing and the second timing, and the second timing is later than the first timing. The NAND string has a dummy memory cell that is located between the select transistor and the memory cell. Besides, in the erasing method, a dummy word line of the dummy memory cell is floated at a third timing. Here, a fixed time interval is between the second timing and the third timing, and the third timing is later than the second timing. A voltage of a gate of the select transistor is boosted to a first electrical potential due to capacitance coupling between the gate and the substrate region, and the first electrical potential is lower than the erasing voltage. The first electrical potential is boosted to be equal to or higher than a voltage that the select transistor does not lead to be broken down due to TDDB. A voltage of the dummy word line of the dummy memory cell is boosted to a second electrical potential due to capacitance coupling between the dummy word line and the substrate region, and the second electrical potential is lower than the first electrical potential.

According to an embodiment of the invention, a semiconductor memory device includes a memory array and an erasing device. The memory array has an NAND string that includes a plurality of memory cells serially connected together, the memory cells on one side are connected to a first select transistor of a bit line, and the memory cells on the other side are connected to a second select transistor of a source line. The erasing device selects a block from the memory array and erases data from the memory cells in the selected block. After a predetermined voltage was applied to word lines of the memory cells and select gate lines of the first and second select transistors in the selected block, the erasing device applies an erasing voltage to a substrate region in the selected block at a first timing, and the erasing device floats the select gate lines of the first and second select transistors at a second timing. Here, a fixed time interval is between the first timing and a second timing, and the second timing is later than the first timing. The NAND string includes a first dummy memory cell that is located between the first select transistor and the memory cells, and the NAND string also includes a second dummy memory that is located between the second select transistor and the memory cells. The erasing device floats dummy word lines of the first and second dummy memory cells at a third timing; here, a fixed time interval is between the second timing and the third timing, and the third timing is after the second timing. Voltages of gates of the first and second select transistors are boosted to a first electrical potential due to capacitance coupling between the gates and the substrate region, and the first electrical potential is lower than the erasing voltage. The first electrical potential is boosted to be equal to or higher than a voltage that the first and second select transistors do not lead to be broken down due to TDDB. Voltages of the dummy word lines of the first and second dummy memory cells are boosted to a second electrical potential due to capacitance coupling between the dummy word lines and the substrate region, and the second electrical potential is lower than the first electrical potential.

In view of the above, compared to the existing method of boosting the voltage of the select transistor by means of capacitance coupling while applying the erasing voltage, the method described herein is applicable to restrain the boosting electrical potential of the select transistor; thereby, the impact of the electric field on the memory cell adjacent to the select transistor can be diminished.

DETAILED DESCRIPTION OF DISCLOSED EMBODIMENTS

Several embodiments of the invention are elaborated below with reference to the drawings. In addition, the drawings depict the invention in an emphatic manner for the purpose of comprehension, and thus the proportion of the depicted components may not be the same as the actual proportion.

Embodiments

Figure 4:
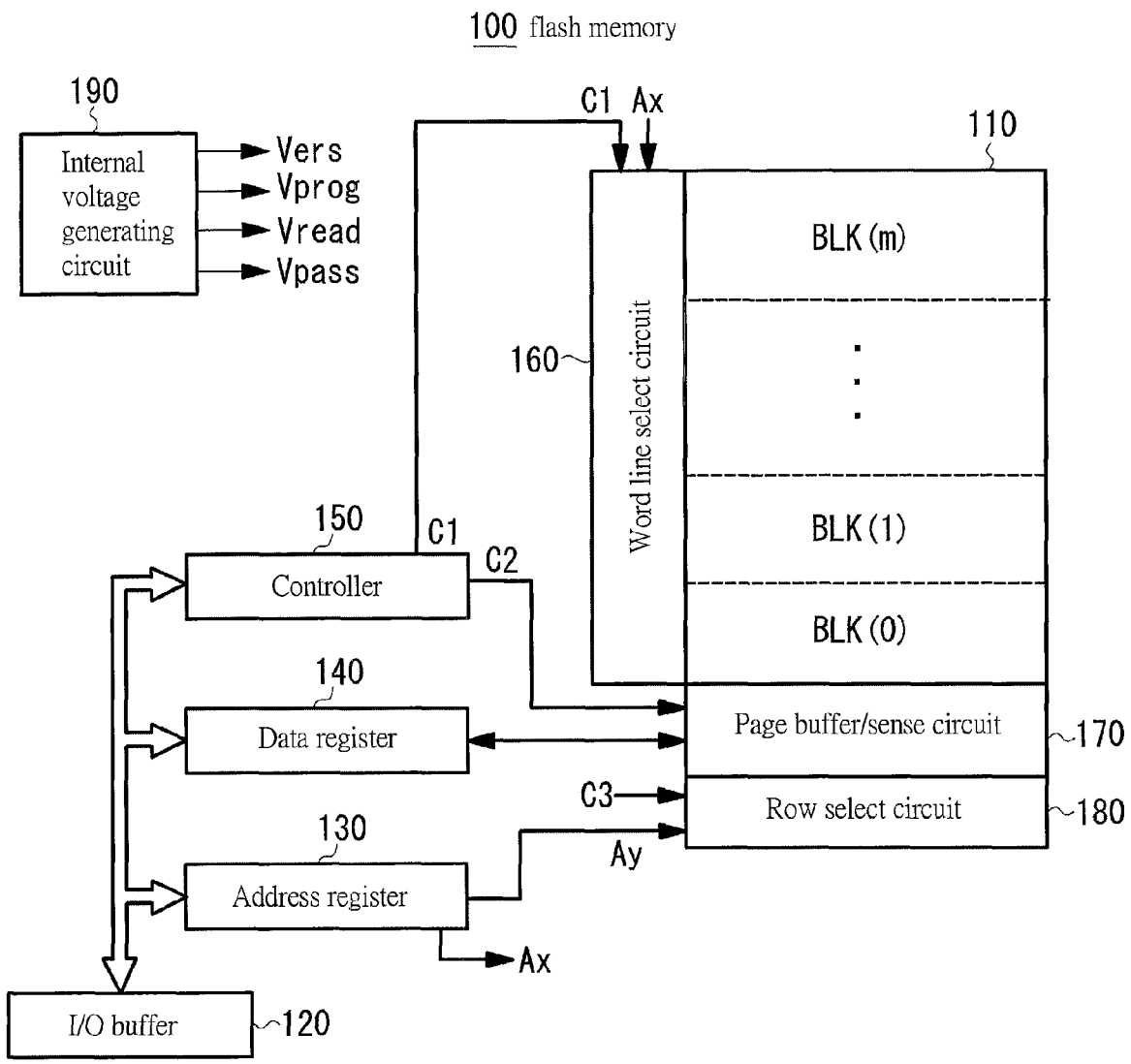
FIG. 4 is a block diagram illustrating components in a flash memory according to an exemplary embodiment of the invention.

FIG. 4 is a block diagram illustrating components in a flash memory according to an exemplary embodiment of the invention. Note that the components in the flash memory provided herein are merely exemplary and should not be construed as limitations to the invention.

According to the present embodiment, the components in the flash memory 100 include a memory array 110, an input/output (I/O) buffer 120, an address register 130, a data register 140, a controller 150, a word line select transistor 160, a page buffer/sense circuit 170, a row select circuit 180, and an internal voltage generating circuit 190. Memory cells arranged in a matrix are formed in the memory cell 110. The I/O buffer 120 is connected to an external I/O terminal and stores I/O data. The address register 130 receives address data from the I/O buffer 120. The data register 140 stores the I/O data. The controller 140 supplies control signals C1, C2, C3, and so forth, and these control signals are applied to control all parts based on the command data from the I/O buffer 120 and external control signals, such as command latch enabling (CLE) signals or address latch enabling (ALE) signals that are not shown in the drawings. The word line select circuit 160 decodes the column address data Ax from the address register 130; based on the decoded result, the word line select circuit 160 selects a block and a word line. The page buffer/sense circuit 170 stores the data read from the page selected by the word line select circuit 160 or stores the data written into the selected page. The row select circuit 180 decodes the row address data Ay from the address register 130; based on the decoded result, the row select circuit 180 selects row data in the page buffer 170. The internal voltage generating circuit 190 generates voltages (e.g., a programming voltage $V_{prog}$, a pass voltage $V_{pass}$, a read pass voltage $V_{read}$, an erasing voltage $V_{ers}$, and so on) required for reading, programming and erasing data.

Figure 1:
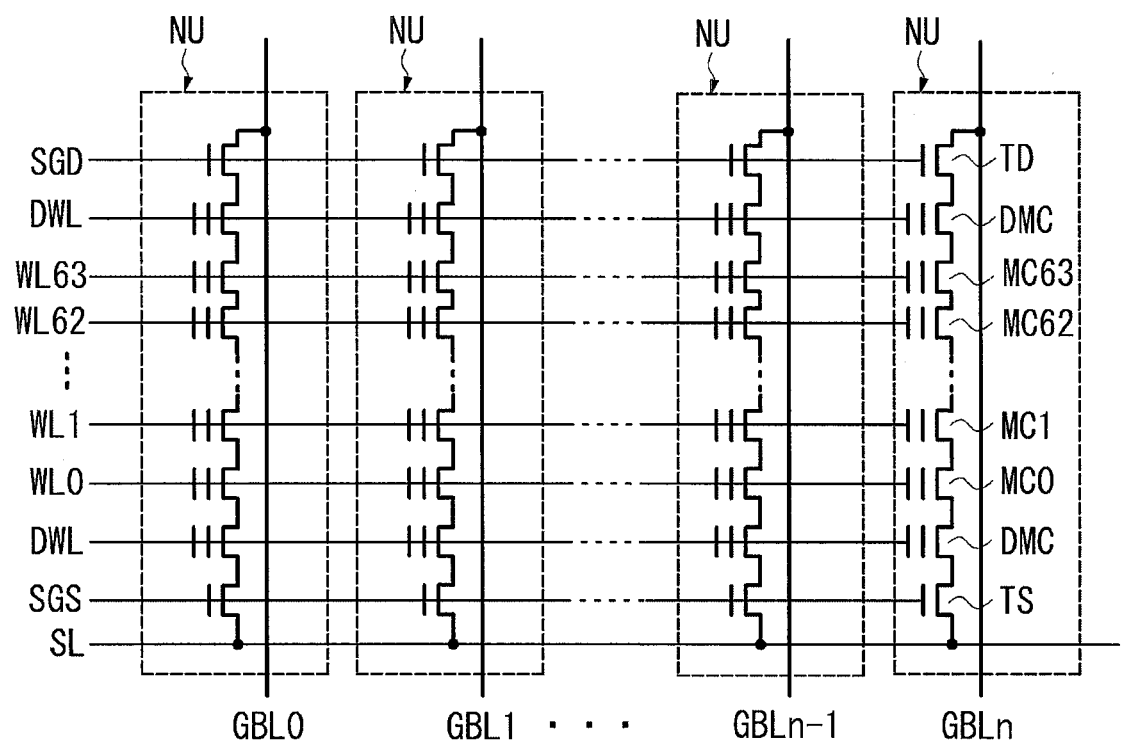
FIG. 1 is a diagram illustrating circuitry of an NAND string of a flash memory.
Figure 2:
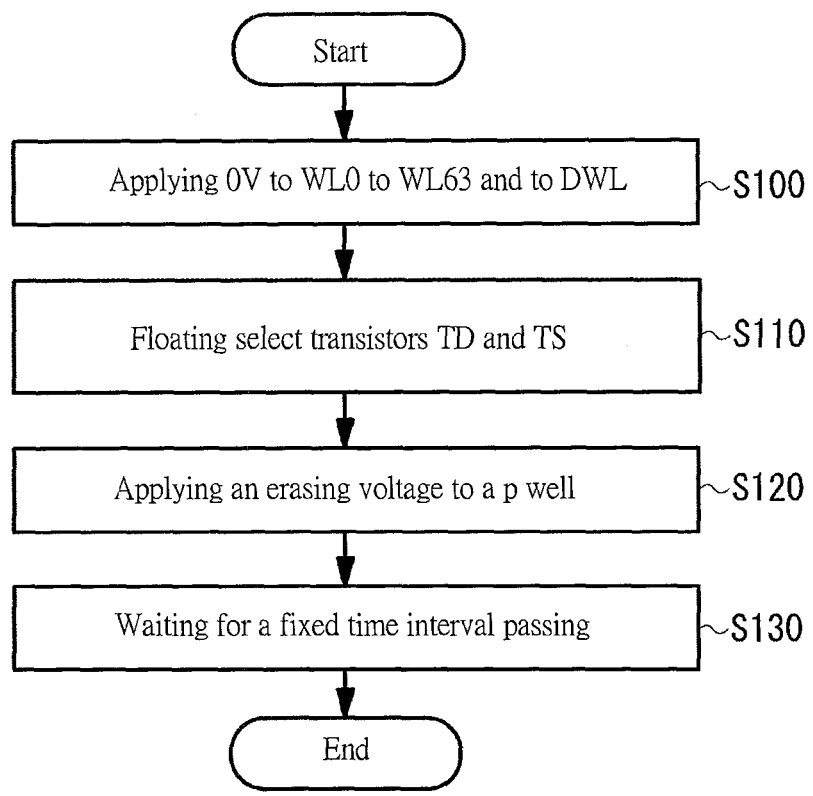
FIG. 2 is a flow chart illustrating an erasing operation on an existing flash memory.

The memory array 110 has a plurality of blocks BLK(0), BLK(1), . . . , and BLK(m) arranged in a row direction. The page buffer/sense circuit 170 is located at one end portion of the blocks. However, the page buffer/sense circuit 170 may also be located at the other end portion or both end portions of the blocks. As shown in FIG. 1, in one block, plural NAND strings NU are formed, and plural memory cells are serially connected by the NAND strings NU.

The control gates of the memory cells $MC_i$ are connected to word lines $WL_i$, the control gates of the dummy memory cells DMC are connected to dummy word lines DWL, and the gates of the select transistors TD and TS are connected to select gate lines SGD and SGS alongside the word lines $WL_i$/the dummy word lines DWL. The word line select circuit 160 selects the block and the word lines $WL_i$/the dummy word lines DWL based on the column address Ax and alternatively selects the select transistors TD and TS according to the select gate signals SGD and SGS.

Typically, each memory cell has a metal-oxide-semiconductor (MOS) structure that includes a source/drain of an n-type diffusion area formed in the p well, a tunnel oxidation film formed on a channel between the source/drain, a floating gate (a charge storage layer) formed on the tunnel oxidation film, and a control gate formed above the floating gate. Here, a dielectric film is located between the control gate and the floating gate. The p well is formed in an n well formed in a p-type silicon substrate, for instance. If the floating gate does not store any electric charges, i.e., if "1" data are written, the threshold value is negative, and the memory cell remains in a normally-on state. By contrast, if the floating gate stores electrons, i.e., if "0" data are written, the threshold value is biased to be positive, and the memory cell remains in a normally-off state. Here, the memory cell is capable of storing binary data and multi-bit data.

Figure 5:
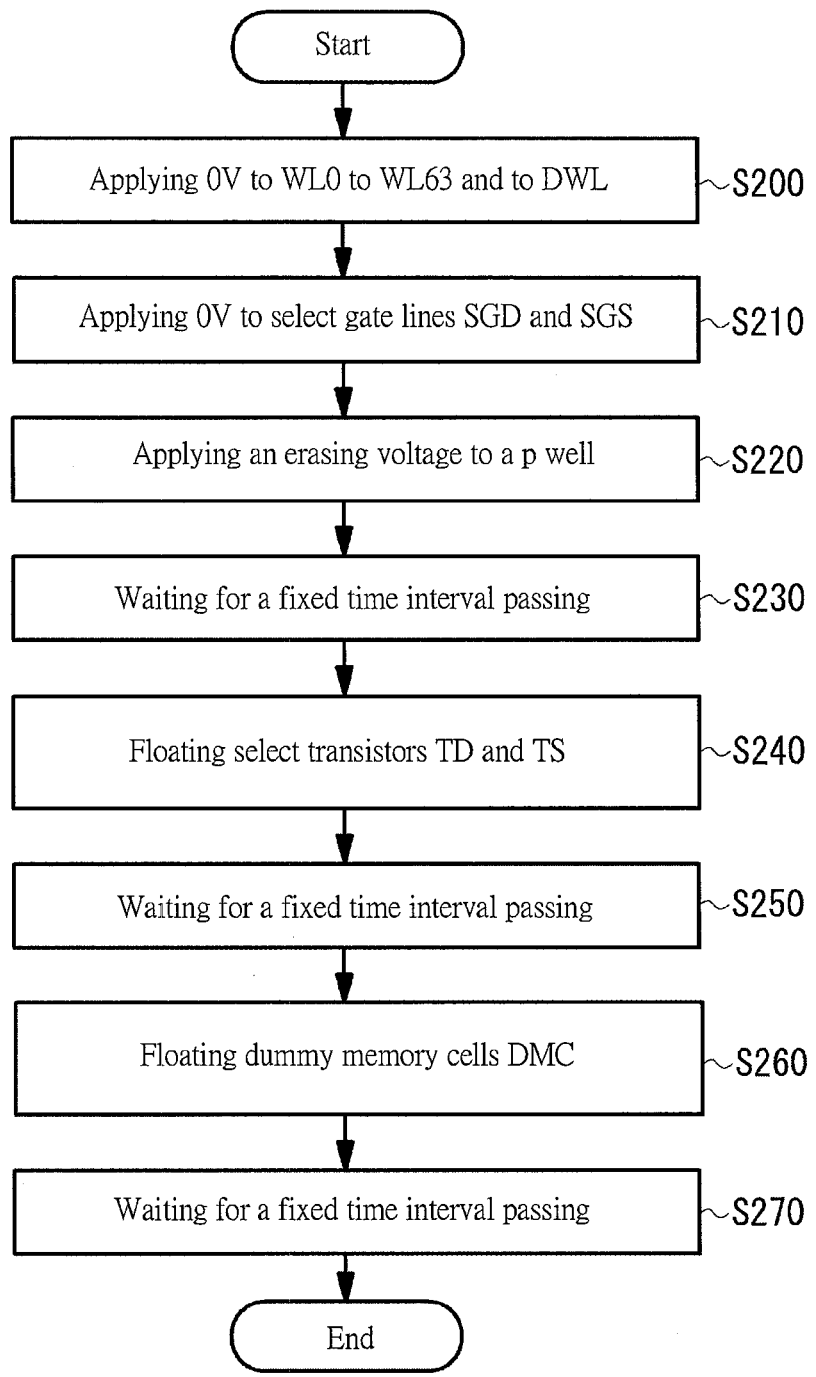
FIG. 5 is a flow chart illustrating an erasing operation on a flash memory according to an exemplary embodiment of the invention.
Figure 6:
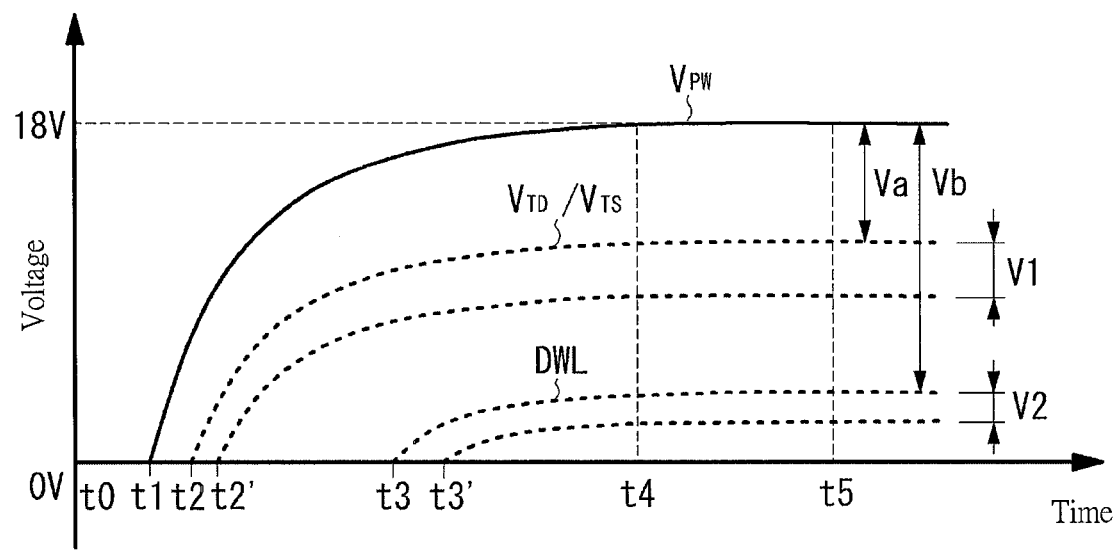
FIG. 6 is a schematic diagram illustrating variations in voltages of a p well, a select transistor, memory cells, and dummy memory cells during an existing erasing operation according to an exemplary embodiment of the invention.

The erasing operation on the flash memory is explained according to the present embodiment. Specifically, FIG. 5 is a flow chart illustrating an erasing operation, FIG. 6 is a schematic diagram illustrating variations in voltages of components, and FIG. 7 is a cross-sectional skeleton diagram illustrating an NAND string.

In an embodiment of the invention, when the controller 150 receives an erasing command or the like from a host end (not shown), the erasing operation is performed. The word line select circuit 160 controlled by the controller 150 selects the block to be erased according to the address data Ax, applies a voltage at 0V to the dummy word lines DWL of the dummy memory cells DMS and the word lines WL0 to WL63 of the memory cells in the selected block (in step S200), and applies a voltage at 0V to the select gate line SGD of the bit line select transistor TD and the select gate line SGS of the source line select transistor TS in the selected block (in step S210). The source line SL and the bit line BL are floated. The steps S200 and S210 can be simultaneously performed, or the step S210 may be performed before the step S200. Besides, in the steps S200 and S210, the voltage is applied at the timing t0 (shown in FIG. 6).

Figure 7:
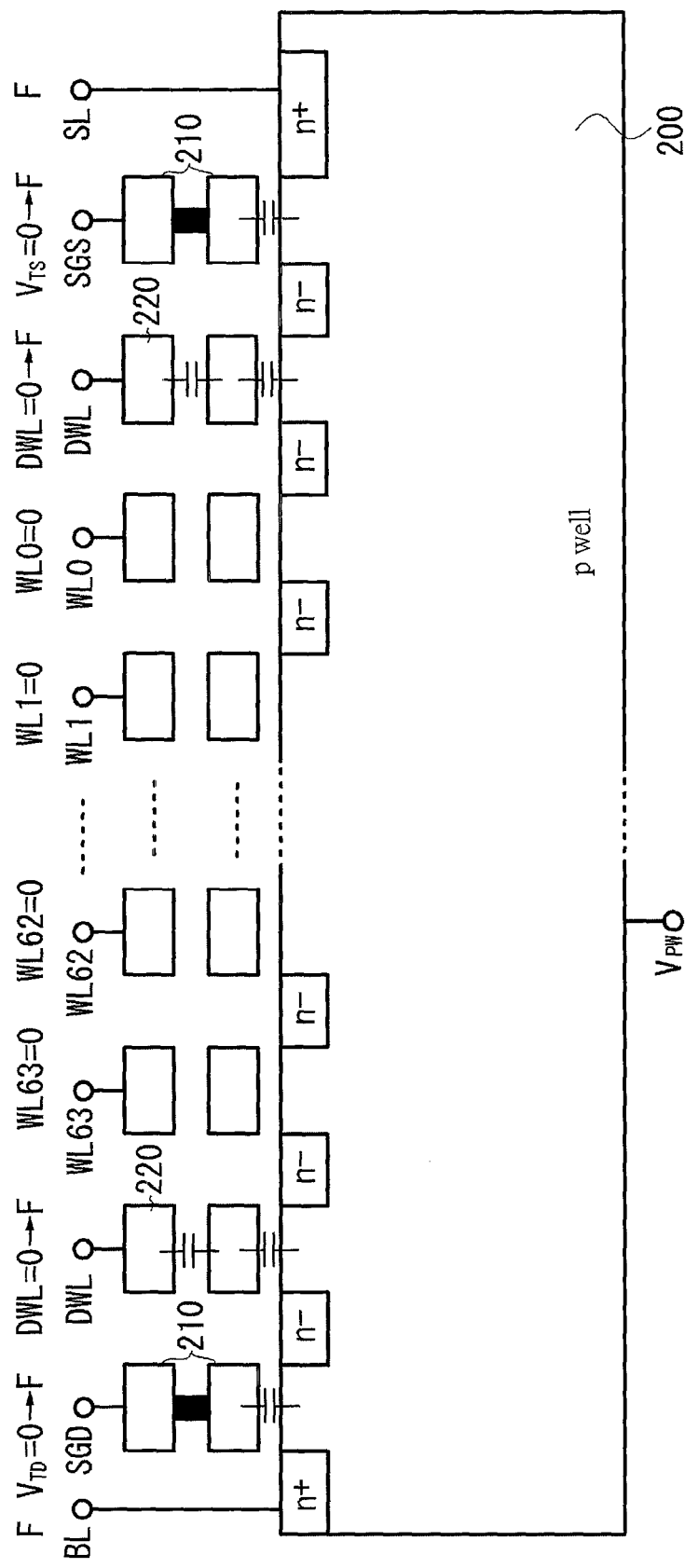
FIG. 7 is a cross-sectional skeleton diagram illustrating an NAND string according to an exemplary embodiment of the invention.

With reference to FIG. 7, the erasing voltage $V_{ers}$ is applied to the p well 200 in step S220. The erasing voltage $V_{ers}$ is generated by the internal voltage generating circuit 190 and is applied to the p well by means of a circuit that is not shown in the drawings. In an embodiment of the invention, an erasing pulse whose voltage gradually increases is applied to the p well time after time, such that the voltage of the p well is boosted to the erasing voltage $V_{ers}$. The erasing voltage $V_{ers}$ starts to be applied at the timing t1 shown in FIG. 6. At the timing t1, the voltage at 0V is applied to the select gate lines SGD and SGS, the word lines $WL_i$, and the dummy word lines DWL; therefore, the control gates of the bit line select transistor TD, the source line select transistor TS, the memory cells MC$_i$, and the dummy memory cells DMC do not capacitance couple to the p well, and the voltages of said control gates stay at 0V.

The select gate line SGD of the bit line select transistor TD and the select gate line SGS of the source line select transistor TS are turned on at the timing t2, such that the select transistors TD and TS are floated (in steps S230 and S240). Here, a fixed time interval is between the timing t1 and the timing t2, and the timing t2 is later than the timing t1. Here, the gates 210 (shown in FIG. 7) of the bit line select transistor TD and the source line select transistor TS are capacitance coupled to the p well 200, so as to boost the voltages of the select transistors TD and TS. The dotted lines in FIG. 6 show that the voltages V$_{TD}$ and V$_{TS}$ of the select transistors TD and TS are raised in direct proportion to the increase in the voltage V$_{PW}$ of the p well due to the capacitance coupling.

The dummy word lines DWL of the dummy memory cells DWL are turned on at the timing t3, such that the dummy memory cells DMC are floated (in steps S250 and S260). Here, a fixed time interval is between the timing t2 and the timing t3, and the timing t3 is later than the timing t2. The control gates 220 of the dummy memory cells DMC are capacitance coupled to the p well 200, so as to start the boost. The dotted lines in FIG. 6 show that the voltages of the dummy word lines DWL are raised in direct proportion to the increase in the voltage V$_{PW}$ of the p well due to the capacitance coupling. The voltage V$_{PW}$ of the p well reaches the erasing voltage V$_{ers}$ at the timing t4. During the period from the timing t4 to the timing t5, the step of waiting for the fixed time interval required for the erasing operation passing is performed (in step S270), and the erasing operation is partially or completely ended.

Figure 3:
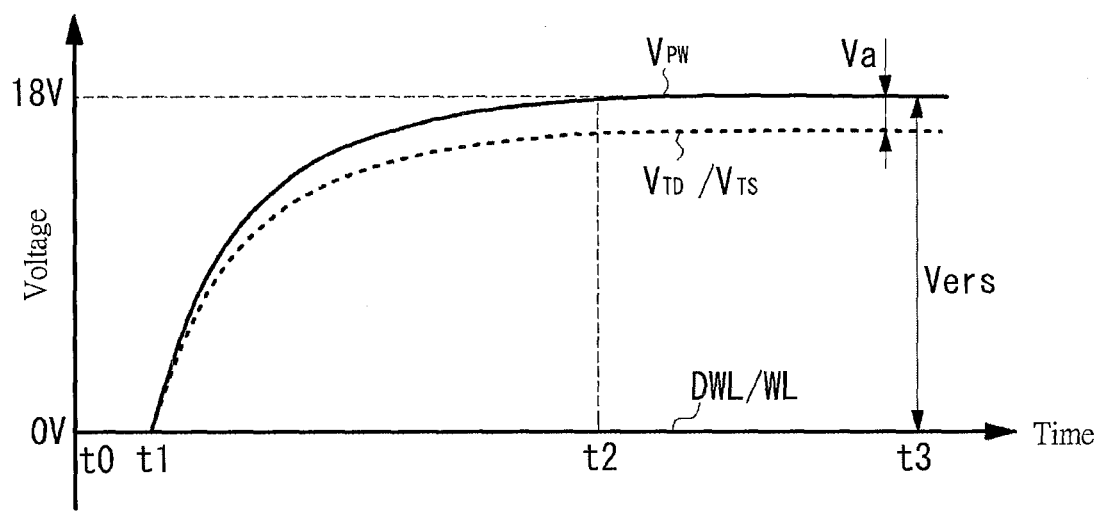
FIG. 3 is a schematic diagram illustrating variations in voltages of a p well, a select transistor, memory cells, and dummy memory cells during an existing erasing operation.

As shown in FIG. 6, at the timing of applying the erasing voltage V$_{esr}$ to the p well 200, the gate voltages V$_{TD}$ and V$_{TS}$ of the select transistors TD and TS are fixed to be at 0V; at the timing t2 delayed from the timing t1, the select transistors TD and TS are floated. As a result, the time of capacitance coupling the select transistors TD and TS and the p well 200 is delayed, and the boosted electrical potential of the gate voltages V$_{TD}$ and V$_{TS}$ are limited. For instance, the gate voltages V$_{TD}$ and V$_{TS}$ are boosted to about 13V (lower than the conventional voltage 17V as shown in FIG. 3).

If the gate voltages V$_{TD}$ and V$_{TS}$ of the select transistors TD and TS are raised to about 17V, due to the capacitance coupling to the select transistors TD and TS, the voltages of the control gates 220 of the dummy memory cells DMC are boosted, and fixed electric field is generated in the floating gate. Thereby, the dummy memory cells DMC cannot be completely erased, and the threshold value cannot be sufficiently biased to be negative. The dummy memory cells DMC mitigate the impact of the select transistors TD and TS on the electric field of the memory cells MC, prevent data in the memory cells MC from being overly erased or programmed, and ideally equalize the threshold value of the dummy memory cells DMC to the threshold value of the memory cells MC. If the difference between the threshold value of the dummy memory cells DMC and the threshold value of the memory cells MC increases, the data reading operation, the data programming operation, or the data verification operation may become unstable. In the present embodiment, the gate voltages V$_{TD}$ and V$_{TS}$ of the select transistors TD and TS are restrained from being boosted; therefore, the impact of the select transistors TD and TS on the dummy memory cells DMC can be mitigated, and the threshold value of the dummy memory cells DMC may be sufficiently biased to negative.

In another aspect, if the gate voltages V$_{TD}$ and V$_{TS}$ of the select transistors TD and TS are lowered, the electrical potential difference V$_a$ between the gate voltages V$_{TD}$ and V$_{TS}$ and the voltage V$_{PW}$ of the p well becomes excessively large, V$_a$<V$_{PW}$−TDDB cannot be satisfied, thus resulting in TDDB of the select transistors TD and TS. Since V$_a$=V$_{PW}$−(V$_{TD}$, V$_{TS}$)<V$_{PW}$−TDDB, (V$_{TD}$, V$_{TS}$)>TDDB should be satisfied. Given that TDDB occurs in case of the voltage at about 5V, the gate voltages V$_{TD}$ and V$_{TS}$ should be boosted to at least 5V.

The boost of the gate voltages V$_{TD}$ and V$_{TS}$ may be adjusted according to the timing t2 at which the select transistors TD and TS are floated. As shown in FIG. 6, if the select transistors TD and TS are floated at the timing t2' later than the timing t2, the timing at which the select transistors TD and TS start to be capacitance coupled to the p well is delayed, and the boost of the gate voltages V$_{TD}$ and V$_{TS}$ is restrained. Compared to the gate voltages V$_{TD}$ and V$_{TS}$ at the timing t2, the gate voltages V$_{TD}$ and V$_{TS}$ at the timing t2' are reduced by V1. By adjusting the timing at which the select transistors TD and TS are floated, the boost of the gate voltages V$_{TD}$ and V$_{TS}$ corresponding to TDDB may be determined.

In the present embodiment, at the timing t3, the dummy word lines DWL with the voltage at 0V are changed to be in the floating state, such that the voltages of the control gates 220 of the dummy memory cells DMC are boosted to a fixed electrical potential lower than the boosted electrical potential of the select transistors TD and TS. Thereby, adjacent memory cells MC63 and MC0 are partially capacitance coupled, such that the electrical potential of the control gates of the memory cells MC63 and MC0 is raised to some degree. Accordingly, the data in the memory cells MC63 and MC0 are not overly erased, and the shift of the variation of the threshold value can be inhibited. In an embodiment of the invention, after the select transistors TD and TS are floated at the timing t2 and before the voltage V$_{PW}$ of the p well reaches the erasing voltage V$_{ers}$ (18V) at the timing t3, the dummy word lines DWL are floated. Thereby, the voltages of the dummy word lines DWL may be raised in direct proportion to the increase in the voltage V$_{PW}$ of the p well. As discussed above, if the timing t3 at which the dummy word lines DWL are floated is delayed to the timing t3', the timing at which the dummy word lines DWL start to be capacitance coupled to the p well is delayed. Compared to the boost voltages at the timing t3, the boost voltages at the timing t3' are reduced by V2.

In the present embodiment, the timing t2 at which the select transistors TD and TS are floated may be delayed from the timing t1 of applying the erasing voltage, such that the timing at which the select transistors TD and TS start to be capacitance coupled to the p well is delayed, and the boosted electrical potential of the select transistors TD and TS is restrained to be equal to or lower than a constant level. Thereby, the impact on the dummy memory cells DMC may be lessened. Moreover, due to the capacitance coupling effect, the voltages of the select transistors TD and TS may be boosted in direct proportion to the increase in the voltage V$_{PW}$ of the p well; as a result, the damages caused by boosting the voltages of the select transistors TD and TS may be diminished.

The way to drive the select gate signals SDG and SGS of the select transistors TD and TS and the dummy word lines DWL of the dummy memory cells DMC is controlled by the word line select circuit 160. By applying the well known circuitry technology, e.g., clock control or delay circuit, the word line select circuit 160 is able to correctly control the floating time of the select transistors TD and TS or the dummy word lines DWL according to the predetermined setup.

Figure 8:
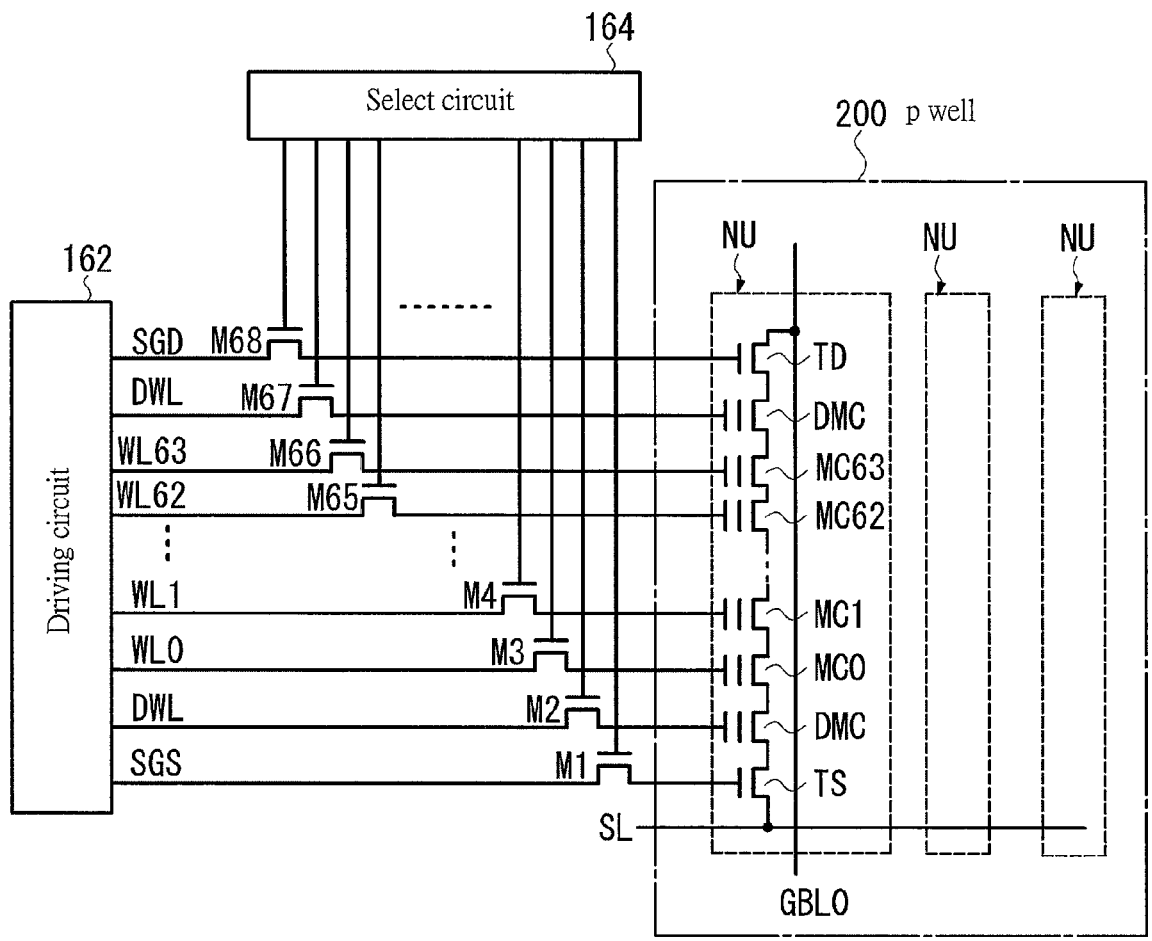
FIG. 8 is a block diagram illustrating a word line driving circuit according to an exemplary embodiment of the invention.

FIG. 8 is a diagram illustrating internal components in a word line driving circuit according to an exemplary embodiment of the invention. As shown in FIG. 8, the driving circuit 162 supplies the predetermined voltages to the select gate lines SGD and SGS, the dummy word lines DWL, and the word lines WL through the transmission transistors M1 to M68 having the n-channel MOS structure. The select circuit 164 supplies the select control signal to the gates of the transmission transistors M1 to M68 and controls the transmission transistors M1 to M68 to be turned on or off.

When the data in the selected block in the memory array are to be erased, the driving circuit 162 supplies the voltage at 0V to the select gate lines SGD and SGS, the dummy word lines DWL, and the word lines WL, and the select circuit 164 supplies the select control signal at the H level to the transmission transistors M1 to M68, so as to turn on the transmission transistors M1 to M68. At the timing t1, the erasing voltage $V_{ers}$ is applied to the p well 200 by means of a circuit not shown in the drawings. At the timing t2, the select circuit 164 supplies the select control signal at the L level to turn off the transmission transistors M1 and M68 connected to the select gate lines SGD and SGS. At the timing t3, the select circuit 164 supplies the select control signal at the L level to turn off the transmission transistors M2 and M67 connected to the dummy word lines DWL.

In an embodiment of the invention, the dummy memory cells are located on two sides of the NAND string; however, the NAND string described herein may not include the dummy memory cells. That is, in the NAND string described herein, the bit line select transistor TD connected to the memory cell MC63 and the source line select transistor TS connected to the memory cell MC0 may be applied. In an embodiment of the invention, before the erasing voltage is applied to the p well, the voltage 0V is applied to the select gate lines SGD and SGS of the select transistors TD and TS or applied to the gates of the select transistors TD and TS. Note that the voltages of the select transistors TD and TS are fixed to a voltage which is not boosted due to the capacitance coupling between the p well and the select transistors TD and TS. Additionally, in an embodiment of the invention, the n well is formed on the p-type semiconductor substrate, and the p well is formed in the n well; however, it is also likely to form the NAND string on the p-type semiconductor substrate.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An erasing method for erasing a semiconductor memory device having a memory array, the memory array having an NAND string, the erasing method comprising:
    applying a predetermined electrical potential to a gate of a select transistor of the NAND string and applying the predetermined electrical potential to a word line of a memory cell of the NAND string;
    applying an erasing voltage to a substrate region having the NAND string at a first timing; and
    floating the gate of the select transistor at a second timing, wherein a fixed time interval is between the first timing and the second timing, and the second timing is later than the first timing,
    wherein a voltage of the gate of the select transistor is boosted to a first electrical potential due to capacitance coupling between the gate and the substrate region, and the first electrical potential is lower than the erasing voltage.

2. The erasing method as recited in claim 1, wherein the NAND string has a dummy memory cell located between the select transistor and the memory cell, the erasing method comprises floating a dummy word line of the dummy memory cell at a third timing, a fixed time interval is between the second timing and the third timing, and the third timing is later than the second timing.

3. The erasing method as recited in claim 2, wherein a voltage of the dummy word line of the dummy memory cell is boosted to a second electrical potential due to capacitance coupling between the dummy word line and the substrate region, and the second electrical potential is lower than the first electrical potential.

4. The erasing method as recited in claim 1, wherein the first electrical potential is boosted to be equal to or higher than a voltage that the select transistor does not lead to be broken down due to time dependent dielectric breakdown.

5. A semiconductor memory device comprising:
    a memory array having an NAND string, the NAND string comprising a plurality of memory cells serially connected together, the memory cells on one side being connected to a first select transistor of a bit line, the memory cells on the other side being connected to a second select transistor of a source line; and
    an erasing device selecting a block from the memory array and erasing data from the memory cells in the selected block,
    wherein after a predetermined voltage was applied to word lines of the memory cells and select gate lines of the first and second select transistors in the selected block, the erasing device applies an erasing voltage to a substrate region in the selected block at a first timing, and floats the select gate lines of the first and second select transistors at a second timing, a fixed time interval is between the first timing and a second timing, and the second timing is later than the first timing,
    wherein voltages of gates of the first and second select transistors are boosted to a first electrical potential due to capacitance coupling between the gates and the substrate region, and the first electrical potential is lower than the erasing voltage.

6. The semiconductor memory device as recited in claim 5, wherein the NAND string comprises a first dummy memory cell located between the first select transistor and the memory cells and comprises a second dummy memory located between the second select transistor and the memory cells, the erasing device floats dummy word lines of the first and second dummy memory cells at a third timing, a fixed time interval is between the second timing and the third timing, and the third timing is after the second timing.

7. The semiconductor memory device as recited in claim 6, wherein voltages of the dummy word lines of the first and second dummy memory cells are boosted to a second electrical potential due to capacitance coupling between the dummy word lines and the substrate region, and the second electrical potential is lower than the first electrical potential.

8. The semiconductor memory device as recited in claim 5, wherein the first electrical potential is boosted to be equal to or higher than a voltage that the first and second select transistors do not lead to be broken down due to time dependent dielectric breakdown.

* * * * *